(12) United States Patent
Wei et al.

(10) Patent No.: US 11,693,059 B2
(45) Date of Patent: Jul. 4, 2023

(54) METHOD FOR DETERMINING STATE OF CHARGE OF BATTERY, BATTERY MANAGEMENT SYSTEM, AND ELECTRIC APPARATUS

(71) Applicant: CONTEMPORARY AMPEREX TECHNOLOGY CO., LIMITED, Ningde (CN)

(72) Inventors: Honggui Wei, Ningde (CN); Mingshu Du, Ningde (CN); Yanmin Xie, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 17/847,188

(22) Filed: Jun. 23, 2022

(65) Prior Publication Data
US 2022/0381839 A1 Dec. 1, 2022

Related U.S. Application Data

(63) Continuation of application No. PCT/CN2021/097255, filed on May 31, 2021.

(51) Int. Cl.
*G01R 31/388* (2019.01)
*G01R 31/396* (2019.01)
(Continued)

(52) U.S. Cl.
CPC ........... *G01R 31/388* (2019.01); *G01R 19/10* (2013.01); *G01R 31/367* (2019.01); *G01R 31/374* (2019.01); *G01R 31/396* (2019.01)

(58) Field of Classification Search
CPC .................. G01R 31/3842; G01R 31/392; G01R 31/367; H02J 7/0048; H01M 10/4285; H01M 10/488
(Continued)

(56) References Cited

U.S. PATENT DOCUMENTS 8,264,201 B2 * 9/2012 Tae ............... H02J 7/0014
324/426
2012/0166116 A1 6/2012 Yoshida et al.
(Continued)

FOREIGN PATENT DOCUMENTS

CN 103022583 A 4/2013
CN 103884993 A 6/2014
(Continued)

OTHER PUBLICATIONS

International Search Report and Written Opinion dated Jan. 7, 2022, in corresponding PCT/CN2021/097255, with English translation, 8 pages.
(Continued)

*Primary Examiner* — Vincent Q Nguyen
*Assistant Examiner* — Trung Q Nguyen
(74) *Attorney, Agent, or Firm* — Xsensus LLP

(57) ABSTRACT

The present invention relates to a method for determining a state of charge of a battery, including: (a) acquiring a state of charge of the battery at a current sampling time point tn; (b) acquiring a voltage Vn, a temperature Tn, and a charging rate Cn of the battery at the current sampling time point tn, and a voltage Vi of the battery at a sampling time point ti, and calculating a voltage difference Vn−Vi between the voltage Vn and the voltage Vi; (c) when the voltage difference Vn−Vi is greater than or equal to a preset voltage threshold, calculating a voltage change rate; and (d) when the voltage change rate is greater than or equal to a preset voltage change rate threshold for the first time, acquiring a corrected state of charge of the battery as an actual state of charge of the battery.

11 Claims, 6 Drawing Sheets

(51) Int. Cl.
*G01R 31/367* (2019.01)
*G01R 19/10* (2006.01)
*G01R 31/374* (2019.01)

(58) Field of Classification Search
USPC .. 324/415, 437, 425–435, 126, 756.05, 538, 324/200, 76.11, 530, 207.13, 233, 256, 324/515, 500–750.6
See application file for complete search history.

(56) References Cited

U.S. PATENT DOCUMENTS

2013/0229154 A1* 9/2013 Benjamin ............ G01R 31/378
320/132
2017/0261560 A1 9/2017 Goto

FOREIGN PATENT DOCUMENTS

| CN | 103728566 B | 8/2016 |
|---|---|---|
| CN | 110888065 A | 3/2020 |
| CN | 110927580 A | 3/2020 |
| CN | 112327174 A | 2/2021 |
| CN | 112557928 A | 3/2021 |

OTHER PUBLICATIONS

European search report dated Dec. 8, 2022, in corresponding European patent Application No. 21908120.5, 4 pages.
Office Action dated Jan. 23, 2023, in corresponding European patent Application No. 21908120.5, 7 pages.

* cited by examiner

METHOD FOR DETERMINING STATE OF CHARGE OF BATTERY, BATTERY MANAGEMENT SYSTEM, AND ELECTRIC APPARATUS

CROSS-REFERENCE TO RELATED APPLICATION

This application claims priority to and the benefit of PCT/CN2021/097255, filed May 31, 2021, the entire content of which is incorporated herein by reference.

TECHNICAL FIELD

The present invention relates to the technical field of batteries, and in particular, to a method for determining a state of charge of a battery, a battery management system, and an electric apparatus.

BACKGROUND

State of charge (SOC) is a ratio of the remaining capacity of a battery to the capacity when the battery is fully charged, representing the remaining capacity of the battery. During use of a battery, it is of a great significance accurately learning SOC of the battery in a timely manner.

Currently, main SOC estimation methods for batteries include an ampere-hour integration method and an open-circuit voltage method. The ampere-hour integration method is subject to impact of measurement accuracy, sampling frequency, and initial SOC errors, and as a result the calculation result may have an error. Moreover, the error will continue to accumulate over time, and thus, SOC accuracy of the battery in long-term operation cannot be ensured. For the open-circuit voltage (Open Circuit Voltage, OCV) method, a charging voltage of the battery presents different voltage curves under influences of factors such as different temperatures and C-rates, where SOCs corresponding to the same voltage value are quite different, which results in low accuracy of the acquired SOC.

SUMMARY

In view of the above disadvantages in the prior art, the present invention is intended to provide a method for determining a state of charge of a battery, a battery management system (Battery Management System, BMS), and a vehicle, so as to improve accuracy of SOC estimation.

In order to achieve the above objective, according to a first aspect of the present invention, a method for determining a state of charge of a battery is provided, including:

(a) acquiring a state of charge of the battery at a current sampling time point tn;

(b) acquiring a voltage Vn, a temperature Tn, and a charging rate Cn of the battery at the current sampling time point tn, and a voltage Vi of the battery at a sampling time point ti, and calculating a voltage difference Vn−Vi between the voltage Vn and the voltage Vi, where the sampling time point ti is a time point at which a state of charge of the battery is acquired within a preset time period before the sampling time point tn;

(c) when the voltage difference Vn−Vi is greater than or equal to a preset voltage threshold, calculating a voltage change rate based on the voltage difference Vn−Vi and a time difference tn−ti between the sampling time point tn and the sampling time point ti; and (d) when the voltage change rate is greater than or equal to a preset voltage change rate threshold, acquiring a corrected state of charge of the battery as an actual state of charge of the battery based on correspondences between corrected states of charge, and the preset voltage change rate threshold, temperatures, and charging rates of the battery based on the temperature Tn and the charging rate Cn of the battery at the sampling time point tn.

The actual state of charge of the battery is corrected according to the correspondences between corrected states of charge, and voltage change rates, temperatures, and charging rates, thereby correcting the actual state of charge of the battery more accurately and improving accuracy of the actual SOC. In a preferred implementation solution, the preset voltage threshold is 5 mV.

In some implementation solutions, the sampling time point ti is any one of n-1 sampling time point points at which the state of charge of the battery is acquired within the preset time period before the sampling time point tn, where n is a positive integer, i=1, 2, 3, ..., n-1, and the method includes:

calculating the voltage difference Vn−Vi between the voltage Vn and the voltage Vi in descending order from i to n-1, and when the voltage difference Vn−Vi is greater than or equal to the preset voltage threshold, calculating a voltage change rate according to the following formula:

voltage change rate=$(Vn-Vj)/(tn-tj)$, or voltage change rate=the present voltage threshold/$(tn-tj)$, where Vn−Vj is a voltage difference that is greater than or equal to the preset voltage threshold for the first time among the voltage differences Vn−Vi, and tj is a sampling time point at which a voltage Vj is acquired.

By calculating the voltage difference Vn−Vi between the voltage Vn and the voltage Vi in descending order from i to n-1 and comparing the voltage difference Vn−Vi with the preset voltage threshold, a minimum voltage difference value that is greater than or equal to the preset voltage threshold is acquired so that the accuracy of the voltage change rate that is calculated is highest, and the actual state of charge of the battery can be corrected more accurately. In addition, calculation of all the voltage differences Vn−Vi is omitted, so that the amount of calculation is reduced.

In some other implementation solutions, the sampling time point ti is an earliest sampling time point at which the state of charge of the battery is acquired within the preset time period before the sampling time point tn. In other words, ti is the earliest sampling time point t1 among n-1 sampling time point points, and only calculation of Vn−Vi is performed each time, thereby reducing the amount of calculation and the amount of intermediate data.

In a preferred implementation solution, only when the state of charge of the battery at the sampling time point tn is greater than or equal to a preset state of charge threshold, the voltage Vn, the temperature Tn, and the charging rate Cn of the battery at the sampling time point tn as well as the voltage Vi of the battery at the sampling time point ti are acquired, and the voltage difference Vn−Vi between the voltage Vn and the voltage Vi is calculated.

The voltage change rate is calculated by obtaining the voltage difference Vn−Vi on a high-side of charging, and the voltage change rate is used to correct the state of charge of the battery, so that the actual state of charge of the battery is corrected in a wide high-side-of-charging plateau. In the implementation solution of this application, the high-side of charging refers to a state in which the state of charge of the battery is above the preset state of charge threshold and the voltage change rate of the battery is above the preset voltage change rate threshold, preferably, the preset state of charge threshold is 70%. A person skilled in the art can understand that, since a type and composition of a used battery determine positions of fluctuations in curves of the voltage change rate and SOC of the battery, the preset state of charge threshold may be set to a threshold adaptable to the type and composition of the used battery.

In any implementation solution, the step (d) includes:

(d1) when the voltage change rate is greater than or equal to the preset voltage change rate threshold, respectively comparing the temperature Tn and the charging rate Cn of the battery at the sampling time point tn with a preset temperature range and a preset rate range corresponding to the preset voltage change rate threshold; and (d2) when the temperature Tn and the charging rate Cn of the battery at the sampling time point tn are respectively within the preset temperature range and the preset rate range, acquiring a corrected state of charge of the battery as an actual state of charge of the battery based on correspondences between corrected states of charge, and the preset voltage change rate threshold, temperatures, and charging rates of the battery based on the temperature Tn and the charging rate Cn of the battery at the sampling time point tn.

Whether the temperature and charging rate are respectively within preset ranges is determine, to avoid abnormal data other than those defined in the correspondences.

In any implementation solution, the preset voltage change rate threshold includes a k-level voltage change rate threshold, and the method includes:

when the voltage change rate is greater than or equal to an xth-level voltage change rate threshold, and an xth-level correction flag bit is 1, acquiring a corrected state of charge of the battery as an actual state of charge of the battery based on correspondences between corrected states of charge, and the xth-level voltage change rate threshold, temperatures, and charging rates of the battery based on the temperature Tn and the charging rate Cn of the battery at the sampling time point tn, and resetting the xth-level correction flag bit to 0;

when the voltage change rate is less than the xth-level voltage change rate threshold, or the xth-level correction flag bit is 0, comparing the voltage change rate with an (x-1)th-level voltage change rate threshold, where x=k, k-1, . . . , 3, 2, k is greater than or equal to 3, and the xth-level voltage change rate is greater than the (x-1)th-level voltage change rate threshold;

when the voltage change rate is greater than or equal to a 1st-level voltage change rate threshold, and a 1st-level correction flag bit is 1, acquiring a corrected state of charge of the battery as an actual state of charge of the battery based on correspondences between corrected states of charge, and the 1st-level voltage change rate threshold, temperatures, and charging rates of the battery based on the temperature Tn and the charging rate Cn of the battery at the sampling time point tn, and resetting the 1st-level correction flag bit to 0; and when the voltage change rate is less than the 1st-level voltage change rate threshold, or the 1st-level correction flag bit is 0, returning to the step (b).

Multi-level voltage change rate thresholds are set, implementing multiple corrections of the SOC. More voltage change rate threshold levels mean more opportunities to correct the SOC, and a lower voltage change rate threshold means that an earlier correction opportunity may be obtained.

In any implementation solution, the method includes: filtering the voltage change rate, and comparing the filtered voltage change rate in the step (d) with the preset voltage change rate threshold.

Sampling errors or noise errors will bring about voltage fluctuations, and the filtering may reduce influences of the voltage fluctuations caused by the sampling errors or noise errors.

In some implementation solutions, the filtered voltage change rate is calculated according to the following formula:

$$\text{filtered voltage change rate} = K1^*(\text{voltage change rate at sampling time point } tn) + K2^*(\text{voltage change rate at sampling time point } tm),$$

where the sampling time point tm is a latest sampling time point at which the voltage change rate is calculated before the sampling time point tn, K1 and K2 are weight coefficients, and $K1+K2=1$.

A person skilled in the art should understand that the above algorithm for filtering the voltage change rate is exemplary, and any suitable filtering algorithms may be used to filter the voltage change rate in other implementation solutions.

In any implementation solution, before the step (b), the method includes:

(a1) determining whether the battery is in a charging state, if yes, executing the next step; otherwise, executing the step (a1) again; and (a2) performing monitoring and determining whether a charge current is stable and whether a voltage of the battery at the sampling time point tn is effective, if both yes, executing the next step; otherwise, returning to the step (a1).

Whether the battery is in a charging state is determined, so that SOC correction is merely performed during charging. Stability of a charging current is limited, to ensure that the battery is in a constant-current charging state, further ensuring accuracy of the corrected SOC.

In addition, in the case of an error in a sampling chip, a sampled voltage value may be wrong. Since the general concept of the present invention is based on the sampled voltage value, the reliability of the corrected SOC is ensured by determining whether a current voltage is effective. In some implementation solutions, whether the current voltage is effective is determined according to whether the current voltage of the battery at the sampling time point tn exceeds a preset sampling range, that is, the voltage of the battery at the sampling time point tn is not an effective voltage when being out of the preset sampling range. For example, a normal voltage range of a lithium iron phosphate battery is between 1.5 V and 4.5 V. In one embodiment, whether the voltage is effective is determined based on whether a voltage of the battery at the sampling time point tn is 500 mV to 6000 mV, that is, a voltage lower than 500 mV or higher than 6000 mV is not an effective voltage.

A person skilled in the art should understand that the method for correcting a state of charge of a battery as described in the first aspect of the present invention and any one of the possible implementation solutions of the first aspect may be combined with other SOC estimation methods, thereby providing a more accurate SOC estimation.

According to a second aspect of the present invention, a battery management system is provided. The battery management system includes: at least one processor, and a memory connected to the at least one processor, where the memory stores an instruction, and when the instruction is executed by the at least one processor, the at least one processor is caused to perform the method for correcting a state of charge of a battery as described above in the first aspect and any one of the possible implementation solutions of the first aspect.

According to a third aspect of the present invention, an apparatus is provided. The apparatus includes a battery, and the battery management system according to the second aspect of the present invention. The battery may be used as a power source of the apparatus, or an energy storage unit of the apparatus. The apparatus may be, but is not limited to, a mobile device (for example, a mobile phone or a notebook computer), an electric vehicle (for example, a battery electric vehicle, a hybrid electric vehicle, a plug-in hybrid electric vehicle, an electric bicycle, an electric scooter, an electric golf vehicle, or an electric truck), an electric train, a ship, a satellite, an energy storage system, and the like. A battery may be selected for the apparatus according to requirements for using the apparatus.

BRIEF DESCRIPTION OF THE DRAWINGS

To describe the technical solutions of the present invention more clearly, the following briefly describes the accompanying drawings required for describing the embodiments of the present invention. Apparently, the accompanying drawings in the following description show merely some implementation solutions of the present invention, and a person of ordinary skill in the art may still derive other drawings from the accompanying drawings without creative efforts.

DETAILED DESCRIPTION OF THE EMBODIMENTS

The implementation solutions of the present inventions will be further described below in detail in combination with the drawings.

Figure 1:
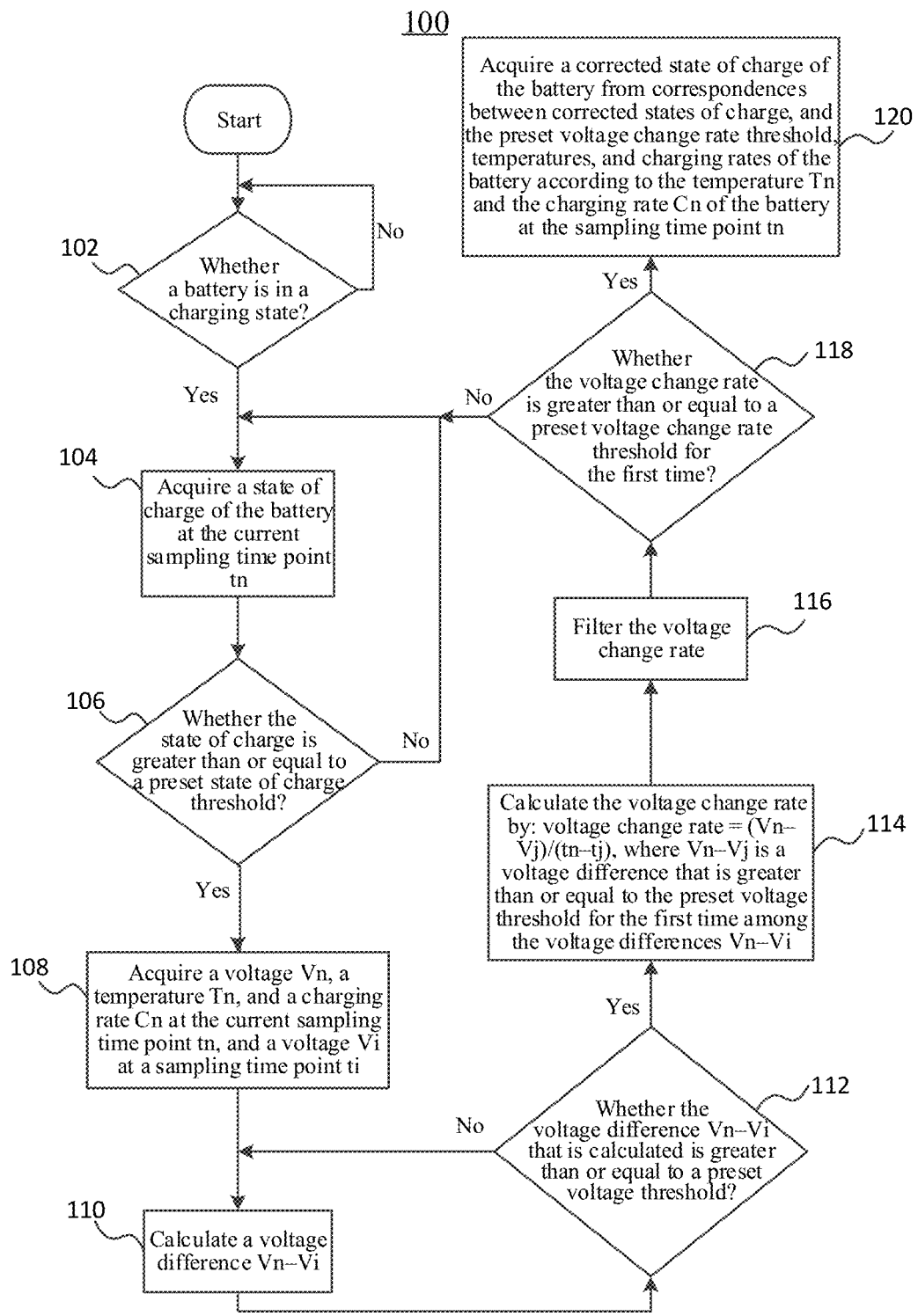
FIG. 1 illustrates a flowchart of a method for correcting a state of charge of a battery according to an implementation solution of the present invention.

FIG. 1 illustrates a flowchart of a method for correcting a state of charge of a battery according to an implementation solution of the present invention. The method for correcting a state of charge of a battery is mainly applied to correct the SOC of the battery on a high-side of charging of the battery.

As shown in FIG. 1, in step 102, whether a battery is in a charging state is detected according to a flow direction of a charging current. If the battery is in a charging state, step 104 is performed; otherwise, step 102 is performed again. In some embodiments, in step 102, it is detected whether the battery is in a charging state as well as whether the charging current is stable and whether a current voltage of the battery is effective. Specifically, in some implementation solutions, by detecting whether the charging current fluctuates, it is determined whether the charging current is in a constant-current charging state, that is, it has a constant charging rate. In addition, in some implementation solutions, whether the current voltage is effective is determined based on whether the current voltage of the battery exceeds a preset sampling range, that is, the current voltage is not an effective voltage when being out of the preset sampling range. For example, a normal voltage range of a lithium iron phosphate battery is between 2.5 V and 3.65 V. In one embodiment, whether the voltage is effective is determined based on whether a voltage of the battery at the sampling time point to is 500 mV to 6000 mV, that is, a voltage lower than 500 mV or higher than 6000 mV is not an effective voltage.

Generally, the battery management system (BMS) acquires or calculates an SOC of a battery in a preset sampling period and collects data such as the voltage, temperature, and charging rate of the battery. Assuming that a current sampling time point is tn, then the acquired voltage is Vn, the acquired temperature is Tn, and the acquired charging rate is Cn at the sampling time point tn, and a sampling time point before the current sampling time point tn is tn-1. In the implementation solution of the present invention, the current sampling time point tn is a latest sampling time point, and the sampling time point tn-1 is a second latest sampling time point.

Figure 3A:
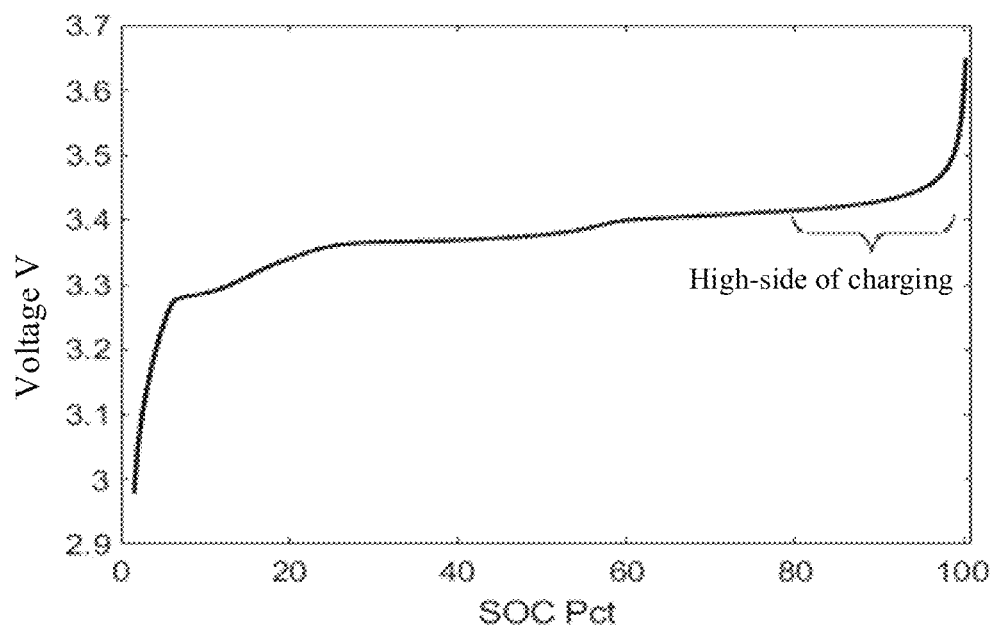
FIG. 3($a$) and FIG. 3($b$) respectively illustrate schematic diagram of a voltage-SOC curve and a voltage change rate-SOC curve of a lithium iron phosphate battery according to an implementation solution of the present invention.
Figure 3B:
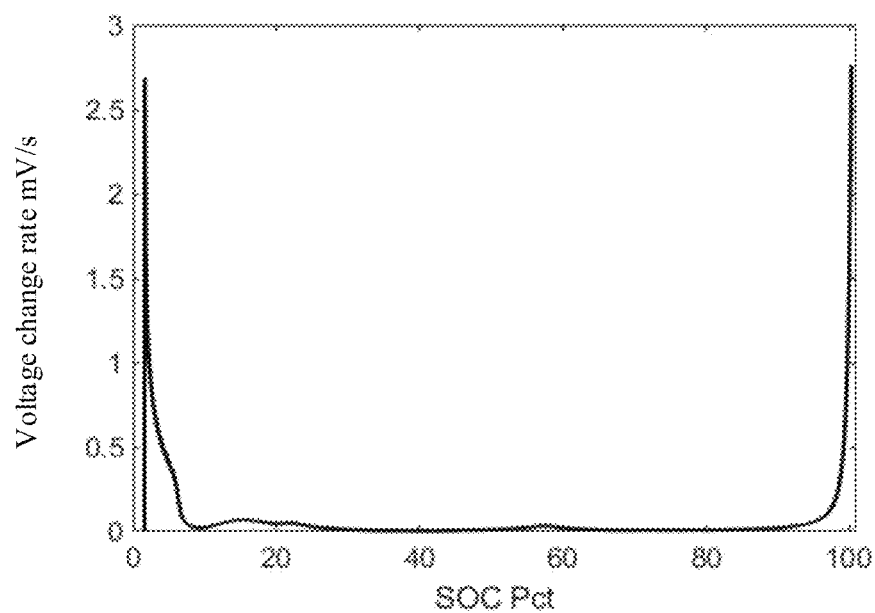

In step 104, an SOC of the battery at the current sampling time point tn is acquired, and in step 106, monitoring is performed to determine whether the battery is located on a high-side of charging. In some implementation solutions, whether the battery is located on a high-side of charging is determined by determining whether the state of charge of the battery is greater than a preset state of charge threshold. If the battery is located on the high-side of charging, step 108 is performed; otherwise, step 104 is performed again. As shown in FIG. 3($b$), a voltage change rate-SOC curve of a lithium iron phosphate battery has an obvious bulge respectively at positions of 20% SOC and 60% SOC around. The implementation solution of the present invention is not applicable to the fluctuation of the voltage change rate. Thus, in the implementation solutions of the lithium iron phosphate battery in FIG. 3($a$) and FIG. 3($b$), the state of charge threshold may be set to 70% so that the fluctuation positions of the voltage change rate in FIG. 3($b$) can be avoided. However, FIG. 3($a$) shows a theoretical range of the high-side of charging, the state of charge threshold is lower than the theoretical range of the high-side of charging, and thus the state of charge threshold is only an operation strategy rather than a theoretical boundary of the high-side of charging. In other implementation solutions, the SOC in which the voltage change rate-SOC curve has fluctuations is different due to a different type and composition of the used battery, so that the state of charge threshold may be set to other appropriate values according to the type and composition and the like of the used battery. In some implementation solutions, more additional conditions (such as voltage and current) may be added to determine whether the battery is located on a high-side of charging.

In step 108, a voltage Vn, a temperature Tn, and a charging rate Cn at the current sampling time point tn, and a voltage Vi at a sampling time point ti are acquired, where the sampling time point ti is a time point at which state of charge of the battery is acquired within a preset time period before the current sampling time point tn. In some implementation solutions, the sampling time point ti is any one of n-1 sampling time point points at which the state of charge of the battery is acquired within the preset time period before the current sampling time point tn, where n is a positive integer, and i=1, 2, 3, . . . , n-1. Then, a voltage difference Vn−Vi between the voltage Vn and the voltage Vi at the sampling time point ti is calculated in descending order from i to n-1, as in step 110. Then in step 112, it is determined whether the voltage difference Vn−Vi that is calculated is greater than or equal to a preset voltage threshold. If the calculated voltage difference Vn−Vi is less than the preset voltage threshold, step 110 is performed to calculate the voltage difference Vn−Vi after a value of i is subtracted from 1; and if the calculated voltage difference Vn−Vi is greater than or equal to the preset voltage threshold, step 114 is performed, that is, there is no need to calculate a voltage difference Vn−Vi corresponding to a smaller i value. In this way, a minimum voltage difference value that is greater than or equal to the preset voltage threshold is acquired, so that the calculated voltage change rate has a highest accuracy, and the actual state of charge of the battery can be corrected more accurately. In addition, it is unnecessary to calculate all voltage differences Vn−Vi, so that the amount of calculation is reduced.

In one implementation solution, in step 114, the voltage change rate is calculated according to the following formula:

voltage change rate=(Vn−Vj)/(tn−tj), where Vn−Vj is a voltage difference that is greater than or equal to the preset voltage threshold for the first time among the voltage differences Vn−Vi, and tj is a sampling time point at which a voltage Vj is acquired.

In another implementation solution, the voltage change rate is calculated according to the following formula:

voltage change rate=preset voltage threshold/(tn−tj), where tj is a time point at which a corresponding voltage Vj of the minimum value Vn−Vj is acquired when the voltage difference Vn−Vi is greater than or equal to the preset voltage threshold and the voltage difference is the minimum.

In another implementation solution, only calculation of the voltage difference Vn−Vi is performed, the voltage difference Vn−Vi is compared with a preset voltage threshold, and when the voltage difference Vn−Vi is greater than or equal to the preset voltage threshold, the voltage change rate is calculated according to the following formula:

voltage change rate=Vn−Vi/(tn−t1).

After the voltage change rate is calculated, in step 116, the calculated voltage change rate is filtered to obtain a smooth voltage change rate-SOC curve. A voltage-SOC curve of the lithium iron phosphate battery and a corresponding voltage change rate-SOC curve are shown in FIG. 3(*a*) and FIG. 3(*b*), respectively. In an implementation solution, the filtered voltage change rate may be calculated according to the following formula:

filtered voltage change rate=K1*(voltage change rate at sampling time point tn)+K2*(voltage change rate at sampling time point *tm*), where the sampling time point tm is a latest sampling time point at which the voltage change rate is calculated before the sampling time point tn, K1 and K2 are weight coefficients, and K1+K2=1.

After the filtered voltage change rate is obtained, the filtered voltage change rate is compared with a voltage change rate threshold selected from a voltage change rate-SOC relational table stored in the BMS, as in step 118. If the filtered voltage change rate is less than the voltage change rate threshold, or a correction flag bit is 0, then returning to step 104. If the filtered voltage change rate is greater than or equal to the voltage change rate threshold, and the correction flag bit is 1, corrected state of charge of the battery is queried from a voltage change rate threshold-SOC query table according to temperature Tn and charging rate Cn of the battery at the sampling time point tn, as in step 120, and the correction flag bit is reset to 0. Table 1 below lists a voltage change rate threshold-SOC query table according to an embodiment. The query table is obtained by setting a specific temperature off line, charging at different charging rates, and recording an SOC value at each rate. The query table calibrated in this way is stored in the BMS.

TABLE 1

Voltage change rate threshold - SOC query table

| | Temperature (° C.) Differential value | | | | |
|---|---|---|---|---|---|
| Rate (C) | 10.9962006 | 15.9962006 | 20.996201 | 25.9962006 | 30.9962006 |
| 0.049460765 | 95.7481481 | 98.1823518 | 100.01169 | 101.236176 | 101.855797 |
| 0.216127431 | 92.5035649 | 94.9377685 | 96.767111 | 97.9915931 | 98.6112139 |
| 0.382794098 | 89.4855092 | 91.9197129 | 93.749056 | 94.9735374 | 95.5931582 |
| 0.549460765 | 86.6939812 | 89.1281849 | 90.957528 | 92.1820094 | 92.8016302 |
| 0.716127431 | 84.1289808 | 86.5631845 | 88.392527 | 89.617009 | 90.2366298 |
| 0.882794098 | 81.790508 | 84.2247117 | 86.054054 | 87.2785362 | 87.898157 |
| 1.049460765 | 79.6785629 | 82.1127665 | 83.942109 | 85.1665911 | 85.7862119 |

Figure 2:
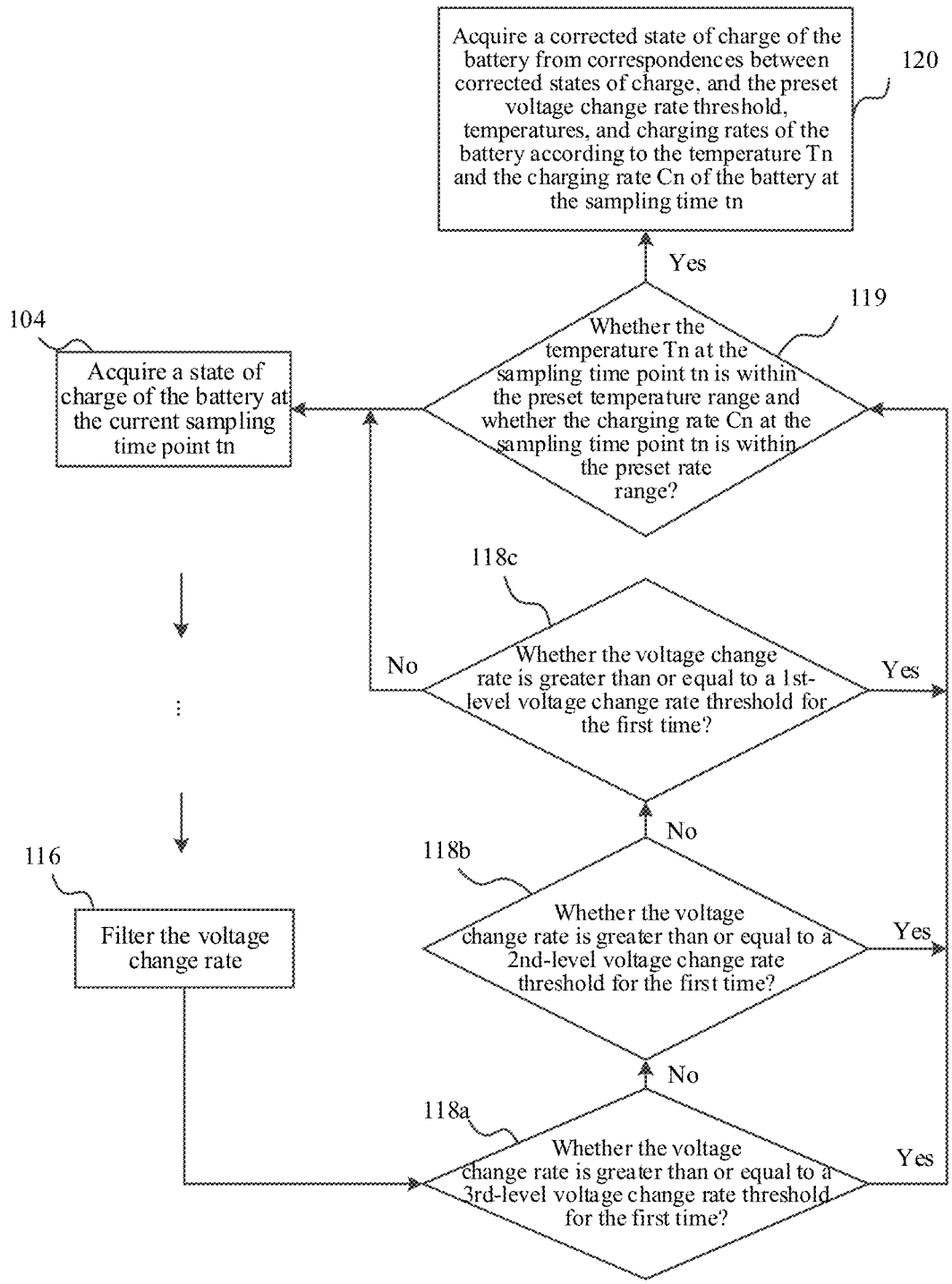
FIG. 2 illustrates a flowchart of part of a method for correcting a state of charge of a battery according to an implementation solution of the present invention.

FIG. 2 illustrates a flowchart of part of a method for correcting a state of charge of a battery according to an implementation solution of the present invention. Different from the flowchart shown in FIG. 1, three-level voltage change rate thresholds are set in FIG. 2, that is, a 3rd-level voltage change rate threshold, a 2nd-level voltage change rate threshold, and a 1st-level voltage change rate threshold, where the 3rd-level voltage change rate threshold is greater than the 2nd-level voltage change rate threshold which is greater than the 1st-level voltage change rate threshold.

After the filtered voltage change rate is obtained, the filtered voltage change rate is compared with the 3rd-level voltage change rate threshold selected from the voltage change rate-SOC relational table stored in the BMS, as in step 118*a*, that is, it is determined whether the filtered voltage change rate is greater than or equal to the 3rd-level voltage change rate threshold for the first time. When the filtered voltage change rate is greater than or equal to the 3rd-level voltage change rate threshold, and a 3rd-level correction flag bit is 1, the 3rd-level correction flag bit is reset to 0, a corrected state of charge of the battery is queried from a 3rd-level voltage change rate threshold-SOC query table according to the temperature Tn and charging rate Cn of the battery at the sampling time point tn, as in step 120.

When the filtered voltage change rate is less than the 3rd-level voltage change rate threshold, or the 3rd-level correction flag bit is 0, the filtered voltage change rate is compared with the 2nd-level voltage change rate threshold selected from the voltage change rate-SOC relational table stored in the BMS, as in step 118b, that is, it is determined whether the filtered voltage change rate is greater than or equal to the 2nd-level voltage change rate threshold for the first time. Similarly, when the filtered voltage change rate is greater than or equal to the 2nd-level voltage change rate threshold, and a 2nd-level correction flag bit is 1, the 2nd-level correction flag bit is reset to 0, and a corrected state of charge of the battery is queried and obtained from a 2nd-level voltage change rate threshold-SOC query table according to the temperature Tn and charging rate Cn of the battery at the sampling time point tn, as in step 120.

Similarly, when the filtered voltage change rate is less than the 2nd-level voltage change rate threshold, or the 2nd-level correction flag bit is 0, the filtered voltage change rate is compared with the 1st-level voltage change rate threshold selected from the voltage change rate-SOC relational table stored in the BMS, as in step 118c, that is, it is determined whether the filtered voltage change rate is greater than or equal to the 1st-level voltage change rate threshold for the first time. When the filtered voltage change rate is greater than or equal to the 1st-level voltage change rate threshold, and a 1st-level correction flag bit is 1, the 1st-level correction flag bit is reset to 0, a corrected state of charge of the battery is queried and obtained from a 1st-level voltage change rate threshold-SOC query table according to the temperature Tn and charging rate Cn of the battery at the sampling time point tn, as in step 120. When the filtered voltage change rate is less than the 1st-level voltage change rate threshold, or the 1st-level correction flag bit is 0, step 104 is performed.

In a preferred embodiment, the 3rd-level voltage change rate threshold is 0.09, the 2nd-level voltage change rate threshold is 0.07, and the 1st-level voltage change rate threshold is 0.05. It can be seen from FIG. 3(b) that by using a greater voltage change rate threshold, the voltage fluctuates more greatly, and the correction accuracy is higher; but by using a smaller voltage change rate threshold, a correction opportunity can be obtained earlier. A person skilled in the art may understand that the voltage change rate threshold and its number may be set according to the used battery, and more voltage change rate thresholds used means more opportunities for correction.

In addition, as shown in FIG. 2, between step 118a and step 120, the temperature Tn and the charging rate Cn of the battery at the sampling time point to may be compared with a preset temperature range and a preset rate range corresponding to the 3rd-level voltage change rate threshold, as in step 119. When the temperature Tn is within the preset temperature range and the charging rate Cn is within the preset rate range, the corrected state of charge of the battery may be queried and obtained from the 3rd-level voltage change rate threshold-SOC query table according to the temperature Tn and the charging rate Cn. When the temperature Tn is out of the preset temperature range, or the charging rate Cn is out of the preset rate range, step 104 is performed. According to examples in Table 1, the preset temperature ranges from 10° to 31°, and the preset charging rate ranges from 0.045 C to 1.05 C. Whether the temperature and charging rate are within the preset ranges respectively is determined, to avoid abnormal data other than data in the 3rd-level voltage change rate threshold-SOC query table. Similarly, between step 118b and step 120, the temperature Tn and the charging rate Cn may be respectively compared with the preset temperature range and the preset rate range corresponding to the 2nd-level voltage change rate threshold; between step 118c and step 120, the temperature Tn and the charging rate Cn may be respectively compared with the preset temperature range and the preset rate range corresponding to the 1st-level voltage change rate threshold.

Figure 4:
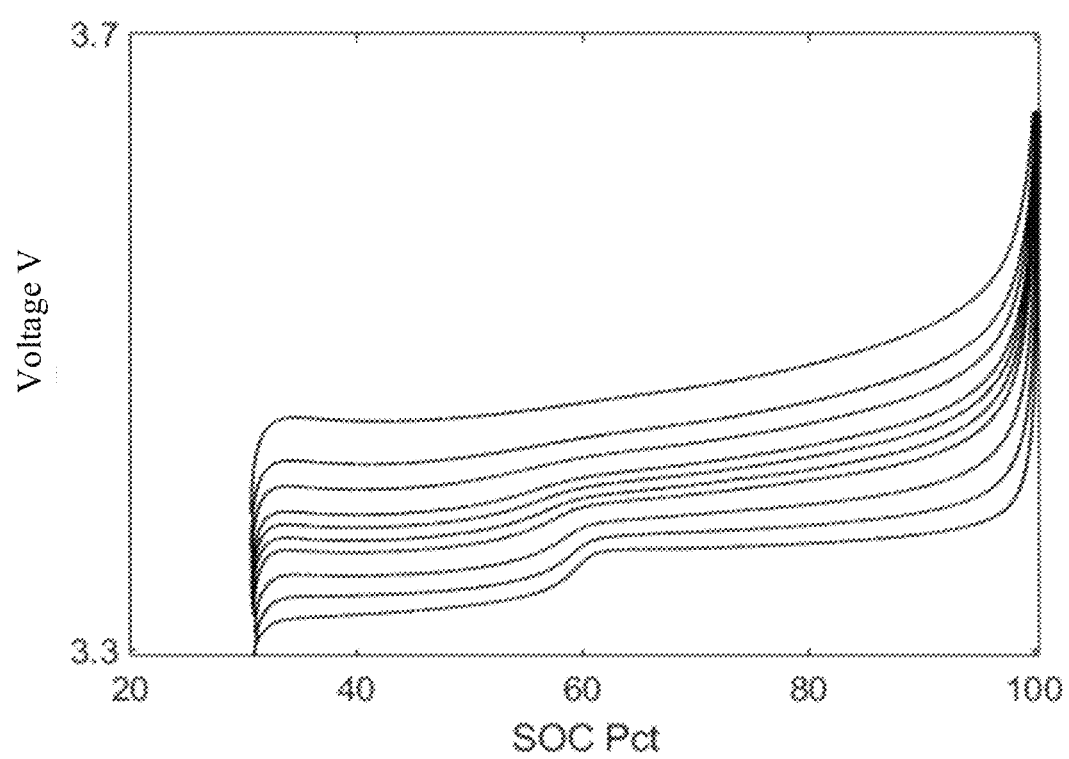
FIG. 4 is a schematic diagram of multiple voltage-SOC curves under different temperatures and charging rates according to an implementation solution of the present invention.
Figure 5:
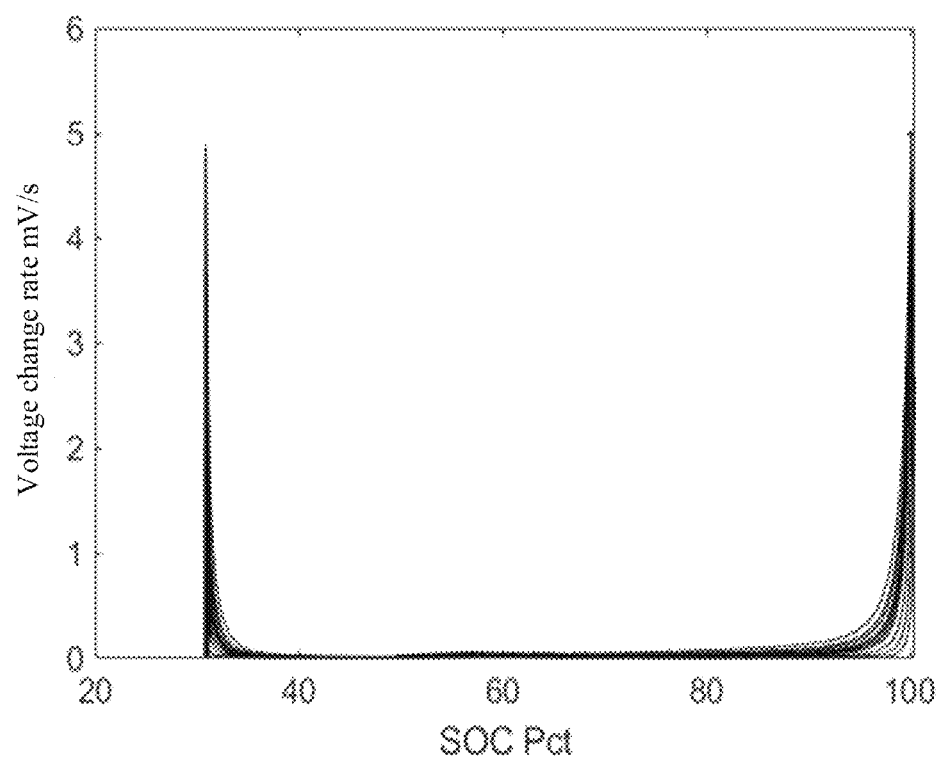
FIG. 5 is a schematic diagram of multiple voltage change rate-SOC curves of a battery under different temperatures and charging rates according to an implementation solution of the present invention.

The inventors of the present invention have found in research that the charging voltage of the battery presents different voltage-SOC curves under influences of factors such as different temperatures (including an initial temperature), charging rates, and initial SOC, as shown in FIG. 4. The different curves on a high-side of charging are relatively scattered, and high-side SOCs corresponding to the same voltage value are quite different, resulting in low accuracy of the corrected SOC. In contrast, the voltage change rate has an increasing trend, and the voltage change rate-SOC curve is stable, as shown in FIG. 5. Different curves on a high-side of charging is relatively concentrated, and high-side SOCs corresponding to the same voltage change rate are relatively close, resulting in high accuracy of the corrected SOC. According to a large number of experiments and statistics, correction accuracy of SOC on the high-side of charging according to the voltage and according to the voltage change rate is obtained, as shown in Table 2 below.

TABLE 2

Correction accuracy of SOC on high-side of charging according to voltage and according to voltage change rate

| SOC | 80 | 85 | 90 | 95 | 100 |
| --- | --- | --- | --- | --- | --- |
| Voltage | <6% | <5% | <3% | <2% | 0 |
| Differential | <3% | <2% | <2% | <1% | 0 |

Figure 6:
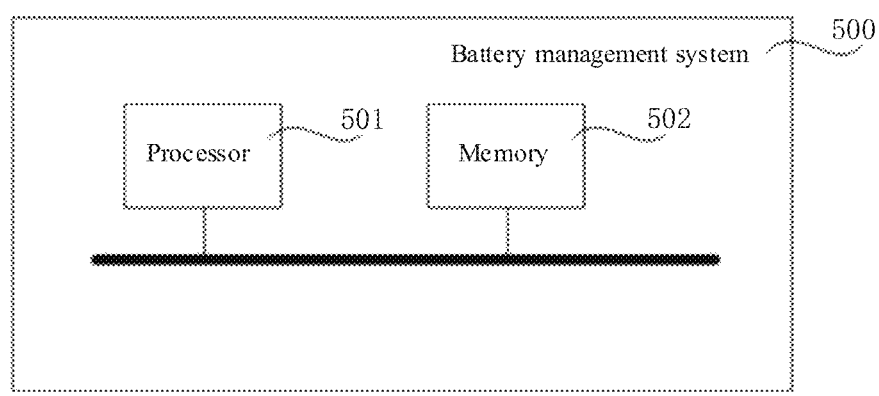
FIG. 6 is a schematic diagram of a battery management system according to an implementation solution of the present invention.

Based on the same inventive concept, referring to FIG. 6, a battery management system 500 is further provided in the implementation solution of the present invention, including at least one processor 501, and a memory 502 that is in communication connection with the processor 501, where the memory 502 stores an instruction that may be executed by the processor, and the instruction, when executed by the processor 501, causes the processor 501 to be able to perform the method for correcting a state of charge of a battery according to the implementation solution of the present invention.

The processor 501 and the memory 502 are in direct or indirect electric connection to achieve transmission or interaction of data. For example, electric connection between these elements may be achieved through one or multiple communication buses or signal buses. The method for correcting a state of charge of a battery includes at least one software function module that is stored in the memory 502 in a form of software or firmware.

The processor 501 may be an integrated circuit chip with a signal processing capability. The processor 501 may be a universal processor, including a Central Processing Until (CPU), a Network Processor (NP), and the like, and may also be a digital signal processor, an application-specific integrated circuit, a field-programmable gate array, or another programmable logic device, a discrete gate or transistor logic device, and a discrete hardware component. The processor may implement or execute the methods, steps and logical block diagrams that are disclosed in the implementation solutions of the present invention. The universal processor may be a microprocessor or the processor may also be any conventional processor, and the like.

The memory 502 may store various software programs and modules, for example, program instructions/modules corresponding to the method and apparatus for correcting a state of charge of a battery according to the implementation solution of the present invention. By running software programs and modules stored in the memory 502, the processor 501 executes various functional applications and data processing, that is, implements the method in the implementation solution of the present invention.

The memory 502 may include, but is not limited to, a RAM (Random Access Memory, random access memory), a ROM (Read Only Memory, read only memory), a PROM (Programmable Read-Only Memory, programmable read-only memory), an EPROM (Erasable Programmable Read-Only Memory, erasable programmable read-only memory), an EEPROM (Electric Erasable Programmable Read-Only Memory, electrically erasable programmable read-only memory), or the like.

The foregoing implementation solutions and specific examples in the method for correcting a state of charge of a battery are also applicable to the battery management system 500 shown in FIG. 6. Through the detailed description of the foregoing method for correcting a state of charge of the battery, a person skilled in the art can clearly learn the implementation method of the battery management system 500 in FIG. 6. Therefore, for the sake of brevity of the specification, details are not repeated herein.

In addition, the present invention further provides an apparatus. The apparatus includes a battery and the battery management system as shown in FIG. 6. The battery may be used as a power source of the apparatus, or an energy storage unit of the apparatus. The apparatus may be, but is not limited to, a mobile device (for example, a mobile phone or a notebook computer), an electric vehicle (for example, a battery electric vehicle, a hybrid electric vehicle, a plug-in hybrid electric vehicle, an electric bicycle, an electric scooter, an electric golf vehicle, or an electric truck), an electric train, a ship, a satellite, an energy storage system, and the like. A battery may be selected for the apparatus according to requirements for using the apparatus.

Figure 7:
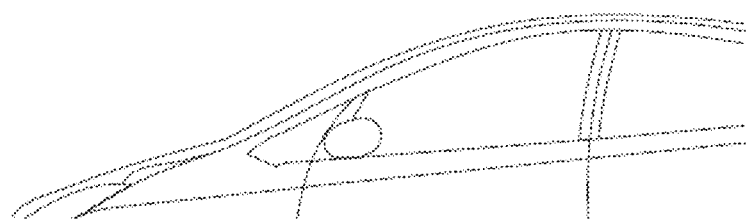
FIG. 7 is a schematic diagram of an electric apparatus that includes a battery management system according to an implementation solution of the present invention.

FIG. 7 shows an apparatus used as an example. The apparatus is a battery electric vehicle, a hybrid electric vehicle, a plug-in hybrid electric vehicle, or the like. In another example, the apparatus may be a mobile phone, a tablet computer, a notebook computer, or the like.

Although the present invention has been described with reference to the preferred embodiments, various modifications can be made to the present invention without departing from the scope of the present invention and the components therein can be replaced with equivalents. In particular, as long as there is no structural conflict, the various technical features mentioned in the embodiments can be combined in any manner. The present invention is not limited to the specific embodiments disclosed in this specification, but includes all technical solutions falling within the scope of the claims.

What is claimed is:

1. A method for charging a battery, comprising:
performing charging of the battery;
measuring a flow direction of a charging current;
determining that the battery is in a charging state on a basis of the measured flow direction of the charging current by a battery management system;
measuring a state of charge of the battery at a sampling time point tn;
determining that the state of charge of the battery at the sampling time point tn is greater than or equal to a preset state of charge threshold;
measuring a voltage Vn, a temperature Tn, and a charging rate Cn of the battery at the sampling time point tn, and a voltage Vi of the battery at a sampling time point ti, and acquiring a voltage difference Vn−Vi between the voltage Vn and the voltage Vi, wherein the sampling time point ti is a time point at which a state of charge of the battery is acquired within a preset time period before the sampling time point tn;
determining that the voltage difference Vn−Vi is greater than or equal to a preset voltage threshold, and acquiring a voltage change rate based on the voltage difference Vn−Vi and a time difference tn−ti between the sampling time point tn and the sampling time point ti; and
acquiring a voltage change rate threshold-state of charge query table which includes correspondences between corrected states of charge, and temperatures, and charging rates of the battery;
determining that the voltage change rate is greater than or equal to a preset voltage change rate threshold, and acquiring a corrected state of charge of the battery as an actual state of charge of the battery based on the correspondences between corrected states of charge, and the preset voltage change rate threshold, temperatures, and charging rates of the battery based on the temperature Tn and the charging rate Cn of the battery at the sampling time point tn; and
stopping the charging of the battery and determining that the battery is not in the charging state when the corrected state of charge of the battery is greater than a preset charging threshold.

2. The method according to claim 1, wherein the sampling time point ti is any one of n-1 sampling time point points at which the state of charge of the battery is acquired within the preset time period before the sampling time point tn, wherein n is a positive integer, i=1, 2, 3, . . . , n-1, and the method comprises:
calculating the voltage difference Vn−Vi between the voltage Vii and the voltage Vi in descending order from i to n-1, and when the voltage difference Vn−Vi is greater than or equal to the preset voltage threshold, calculating the voltage change rate according to the following formula:

voltage change rate=$(Vn-Vj)/(tn-tj)$, or voltage change rate=the present voltage threshold/$(tn-tj)$, wherein Vn−Vj is a voltage difference that is greater than or equal to the preset voltage threshold for the first time among the voltage differences Vn−Vi, and tj is a sampling time point at which a voltage Vj is acquired.

3. The method according to claim 1, wherein the sampling time point ti is an earliest sampling time point at which the state of charge of the battery is acquired within the preset time period before the sampling time point tn.

4. The method according to claim 1, wherein the preset state of charge threshold is 70%.

5. The method according to claim 1, wherein the step of determining that the voltage change rate is greater than or equal to the voltage change rate threshold and acquiring the corrected state of charge of the battery comprises:
- when the voltage change rate is greater than or equal to the preset voltage change rate threshold, respectively comparing the temperature Tn and the charging rate Cn of the battery at the sampling time point tn with a preset temperature range and a preset rate range corresponding to the preset voltage change rate threshold; and
- when the temperature Tn and the charging rate Cn of the battery at the sampling time point tn are respectively within the preset temperature range and the preset rate range, acquiring a corrected state of charge of the battery as an actual state of charge of the battery based on correspondences between corrected states of charge, and the preset voltage change rate threshold, temperatures, and charging rates of the battery based on the temperature Tn and the charging rate Cn of the battery at the sampling time point tn.

6. The method according to claim 1, wherein the preset voltage change rate threshold comprises k-level voltage change rate thresholds, and the method comprises:
- when the voltage change rate is greater than or equal to an xth-level voltage change rate threshold, and an xth-level correction flag bit is 1, acquiring a corrected state of charge of the battery as an actual state of charge of the battery based on correspondences between corrected states of charge, and the xth-level voltage change rate threshold, temperatures, and charging rates of the battery based on the temperature Tn and the charging rate Cn of the battery at the sampling time point tn, and resetting the xth-level correction flag bit to 0;
- when the voltage change rate is less than the xth-level voltage change rate threshold, or the xth-level correction flag bit is 0, comparing the voltage change rate with an (x-1)th-level voltage change rate threshold;
- wherein x=k, k-1, ..., 3, 2, k is greater than or equal to 3, and the xth-level voltage change rate is greater than the (x-1)th-level voltage change rate threshold;
- when the voltage change rate is greater than or equal to a 1st-level voltage change rate threshold, and a 1st-level correction flag bit is 1, acquiring a corrected state of charge of the battery as an actual state of charge of the battery based on correspondences between corrected states of charge, and the 1st-level voltage change rate threshold, temperatures, and charging rates of the battery based on the temperature Tn and the charging rate Cn of the battery at the sampling time point tn, and resetting the 1st-level correction flag bit to 0; and
- when the voltage change rate is less than the 1st-level voltage change rate threshold, or the 1st-level correction flag bit is 0, returning to the step of measuring the voltage Vn.

7. The method according to claim 1, comprising:
- filtering the voltage change rate, and comparing the filtered voltage change rate in the step of determining that the voltage change rate is greater than or equal to the voltage change rate threshold and acquiring the corrected state of charge of the battery with the preset voltage change rate threshold.

8. The method according to claim 7, wherein the filtered voltage change rate is calculated according to the following formula:

filtered voltage change rate=$K1$*(voltage change rate at sampling time point $tn$)+$K2$* (voltage change rate at sampling time point $tm$), wherein the sampling time point tm is a latest sampling time point at which the voltage change rate is calculated before the sampling time point tn, K1 and K2 are weight coefficients, and K1+K2=1.

9. The method according to claim 1, wherein before the step of measuring the voltage Vn, the method comprises:
- performing monitoring and determining whether a charge is stable and whether a voltage of the battery at the sampling time point tri is effective, if both yes, executing the next step; otherwise, returning to the step of determining that the battery is in the charging state.

10. A battery management system, comprising:
- at least one processor; and
- a memory connected to the at least one processor;
- wherein the memory stores an instruction, and when the instruction is executed by the at least one processor, the at least one processor is caused to perform the method for correcting a state of charge of a battery according to claim 1.

11. An electric apparatus, comprising:
- a battery; and
- the battery management system according to claim 10.

* * * * *